United States Patent [19]
Chang

[11] Patent Number: 5,202,594
[45] Date of Patent: Apr. 13, 1993

[54] LOW POWER LEVEL CONVERTER

[75] Inventor: Ray Chang, Austin, Tex.

[73] Assignee: Motorola, Inc., Schaumburg, Ill.

[21] Appl. No.: 831,022

[22] Filed: Feb. 4, 1992

[51] Int. Cl.$^5$ .......................................... H03K 19/094
[52] U.S. Cl. .................................. 307/475; 307/443; 307/446
[58] Field of Search .............. 307/443, 446, 451, 455, 307/475, 264

[56] References Cited

U.S. PATENT DOCUMENTS

| | | | |
|---|---|---|---|
| 4,794,317 | 12/1988 | van Tran | 307/446 X |
| 4,906,871 | 3/1990 | Iida | 307/475 |
| 4,961,011 | 10/1990 | Ide et al. | 307/446 |
| 4,968,905 | 11/1990 | Sanwo et al. | 307/475 |
| 4,992,681 | 2/1991 | Urakawa et al. | 307/451 X |
| 4,996,443 | 2/1991 | Tateno | 307/264 |
| 5,012,137 | 4/1991 | Muellner | 307/475 |
| 5,047,657 | 9/1991 | Seevinck et al. | 307/264 |
| 5,068,551 | 11/1991 | Bosnyak | 307/475 |
| 5,148,059 | 9/1992 | Chen et al. | 307/475 |

OTHER PUBLICATIONS

Robert A. Kertis, "A 12ns 256K BiCMOS SRAM", ISSCC 88, Feb. 18, 1988, FIG. 2, p. 187.

*Primary Examiner*—David R. Hudspeth
*Attorney, Agent, or Firm*—Daniel D. Hill

[57] ABSTRACT

A low power level converter (20), for converting from one logic level to another, includes six transistors (21 through 26). Two transistors (23 and 25) are connected to form a current mirror. A power supply voltage is provided to both sides of the current mirror through a third and a fourth transistor (22 and 26). The third and fourth transistors receive complementary signals $V_I$ and $\overline{V_I}$. A fifth transistor (21) is connected between the third transistor and the power supply, and a sixth transistor (24) is connected across the current mirror. An output signal, provided at the mirror side of the current mirror, is fed back into the converter at the control electrodes of the fifth and sixth transistors and utilized to prevent a constant undesirable DC current from flowing between the power supply voltage terminals, thereby reducing the power consumption of the converter. One embodiment uses P-channel and N-channel transistors.

12 Claims, 3 Drawing Sheets

LOW POWER LEVEL CONVERTER

FIELD OF THE INVENTION

This invention relates generally to logic circuits, and more particularly, to logic circuits for converting complementary input signals to CMOS or TTL logic levels.

BACKGROUND OF THE INVENTION

There are several integrated circuit logic families available from which to choose when designing an integrated circuit. ECL (emitter-coupled logic) is a type of integrated circuit logic which uses bipolar transistors. CMOS is another type of integrated circuit logic, however CMOS uses complementary MOSFET transistors. ECL circuits have the advantage of high speed, but they consume a large amount of power. CMOS logic circuits have the advantages of low power dissipation, high input resistance, low output resistance, and low noise generation. Combining ECL and CMOS on an integrated circuit therefore provides the important advantages of high speed and low power consumption. ECL is used in those circuit portions requiring higher processing speeds. CMOS is used to reduce power consumption in those circuit portions that are less time-critical.

ECL has short switching times because the swing between high and low logic states is only about one volt. In contrast, CMOS logic states may swing the full rail of the power supply voltage, or approximately 5 volts. Therefore, for integrated circuits utilizing both ECL and CMOS logic, converter circuitry must be provided internally on the integrated circuit for transitioning from ECL to CMOS logic levels.

A prior art level converter 10 is shown in FIG. 1. A pair of N-channel MOS transistors 12 and 13 is connected to form a current mirror. A power supply voltage is provided to supply the current mirror through a pair of P-channel MOS transistors 11 and 14. The gates of the P-channel MOS transistors 11 and 14 receive signals $\overline{V_I}$ and $V_I$, respectively. A CMOS logic signal labelled $V_{OUT}$ is provided on the mirror side of the current mirror at node 15.

Converter 10 provides signal $V_{OUT}$ at a CMOS logic high if $V_I$ is at a logic low (and $\overline{V_I}$ is at a logic high), and provides signal $V_{OUT}$ at a logic low if $V_I$ is at a logic high (and $\overline{V_I}$ is at a logic low). To output a logic high CMOS level, converter 10 receives signal $V_I$ which will be low enough below the threshold voltage ($V_T$) to make the P-channel transistor 14 conductive. When the P-channel transistor 14 is conductive, $V_{OUT}$ is pulled high to $V_{DD}$. $V_I$ will be high enough to cause the P-channel transistor 11 to become substantially non-conductive, which causes node 16 to be discharged through the N-channel transistor 12 to one N-channel $V_T$, which is sufficient to make the N-channel transistor 13 substantially non-conductive. To output a logic low CMOS level, $\overline{V_I}$ will be sufficiently below $V_T$ to make the P-channel transistor 11 conductive and $V_I$ will be sufficiently high to make the P-channel transistor 14 substantially non-conductive. N-channel transistors 12 and 13 are conductive, which causes $V_{OUT}$ to be pulled low to $V_{SS}$. When transistor 11 is conductive, a current path is created through transistor 11 and transistors 12 causing a constant DC current to flow from $V_{DD}$ to $V_{SS}$. This constant DC current is undesirable, but if only a few converters 10 are used on an integrated circuit, the small DC current may be insignificant. However, if a large number of converters 10 are required for a particular application, the total power consumed because of the DC current flow can become substantial.

An example of prior art circuit 10 is described in Pat. No. 4,961,011, issued on Oct. 2, 1990 to Ide et al.

SUMMARY OF THE INVENTION

Accordingly, there is provided, in one form, a low power level converter that reduces the constant DC current described above. The low power level converter comprises six transistors. The first transistor has a first current electrode coupled to a first power supply voltage terminal, a control electrode for receiving a control signal, and a second current electrode. The second transistor has a first current electrode coupled to the second current electrode of the first transistor, a control electrode for receiving a first input signal, and a second current electrode. The third transistor has a first current electrode coupled to the second current electrode of the second transistor, a control electrode coupled to the second current electrode of the second transistor, and a second current electrode coupled to a second power supply voltage terminal. The fourth transistor has a first current electrode coupled to the control electrode of the third transistor, a control electrode coupled to the control electrode of the first transistor for receiving the control signal, and a second current electrode. The fifth transistor has a first current electrode coupled to the second current electrode of the fourth transistor, a control electrode coupled to the second current electrode of the second transistor, and a second current electrode coupled to the second power supply voltage terminal. The sixth transistor has a first current electrode coupled to the first power supply voltage terminal, a control electrode for receiving a second input signal, and a second current electrode coupled to said first current electrode of said fifth transistor and for providing an output signal.

These and other features and advantages will be more clearly understood from the following detailed description taken in conjunction with the accompanying drawings.

DESCRIPTION OF THE PREFERRED EMBODIMENT

Figure 1:
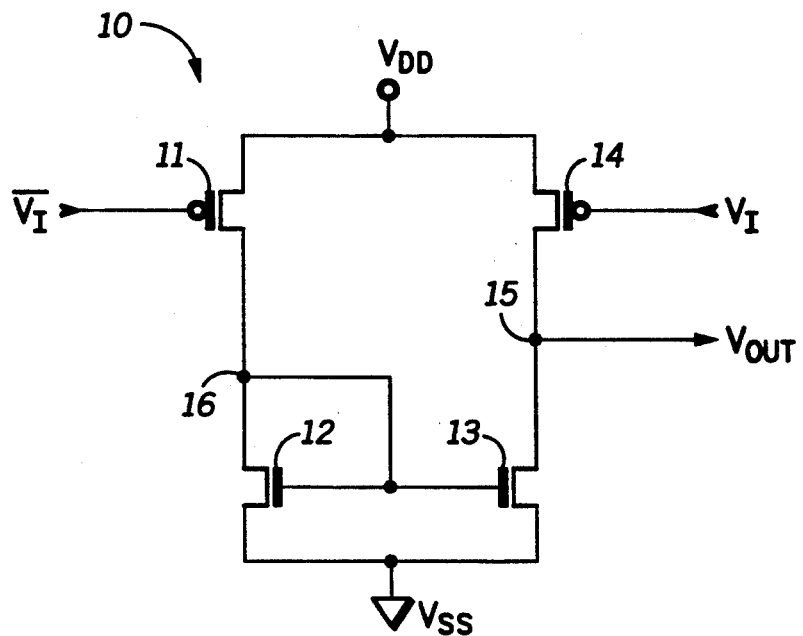
FIG. 1 illustrates in schematic form a prior art level converter circuit.

FIG. 1 illustrates in schematic form a prior art level converter 10. Converter 10 comprises P-channel transistors 11 and 14 and N-channel transistors 12 and 13. Transistor 11 has a source connected to a positive power supply voltage terminal labelled "$V_{DD}$", a gate for receiving an input voltage labelled "$\overline{V_I}$", and a drain. Transistor 12 has its drain and gate connected to the drain of transistor 11 and a source connected to a negative power supply voltage terminal labelled "$V_{SS}$". Transistor 13 has a drain, a source connected to $V_{SS}$, and a gate connected to the drain of transistor 11. Transistor 14 has a source connected to $V_{DD}$, a drain connected to the drain of transistor 13 at node 15 and providing an output signal labelled "$V_{OUT}$" thereon, and a gate for receiving an input voltage labeled "$V_I$".

In order for a P-channel transistor to become conductive, its gate-to-source voltage ($V_{GS}$) must be more negative than the threshold voltage ($V_T$) of the transistor. Typically, $V_T$ is about −1.1 volts, but because of possible manufacturing variations, $V_T$ may be greater than or less than −1.1 volts. In ECL logic circuits, the positive power supply voltage $V_{DD}$ is typically at zero volts, and the negative power supply voltage $V_{SS}$ is typically at −5.0 volts. ECL logic levels are typically about −0.8 volts for a logic high and about −1.6 volts for a logic low. If transistor 11 received an ECL logic low voltage, then the $V_{GS}$ of transistor 11 may, or may not be, sufficiently large to prevent transistor 11 from becoming conductive, resulting in reliability problems. Also, temperature-induced shifts in the ECL levels may prevent $V_{GS}$ from becoming sufficiently negative. To ensure that the logic low voltage of $V_I$ and $\overline{V_I}$ becomes sufficiently negative, input signals $V_I$ and $\overline{V_I}$ may be converted to complementary analog voltages having a lower logic low voltage. For example, when $V_I$ is an ECL logic-high voltage of approximately −0.8 volts, $\overline{V_I}$ may be lowered to approximately −2.3 volts. Thus, the lower logic low voltage will make transistor 11 or 14 conductive.

For converter 10 to output a high CMOS level at node 15, $V_I$ must be negative enough to make P-channel transistor 14 conductive, which pulls $V_{OUT}$ high, to substantially $V_{DD}$. $\overline{V_I}$ will be positive enough to cause P-channel transistor 11 to become substantially non-conductive which causes node 16 to be discharged through N-channel transistor 12 to one N-channel $V_T$. This is just enough to make N-channel transistor 13 substantially non-conductive. For converter 10 to output a low CMOS level, $\overline{V_I}$ will be negative enough to make P-channel transistor 11 conductive and $V_I$ will be positive enough to make P-channel transistor 14 substantially nonconductive. N-channel transistors 12 and 13 form a current mirror and are conductive, which causes $V_{OUT}$ to be pulled more negative to $V_{SS}$. When transistor 11 is conducting, there is a constant DC current flowing through transistor 11 and transistor 12.

Figure 2:
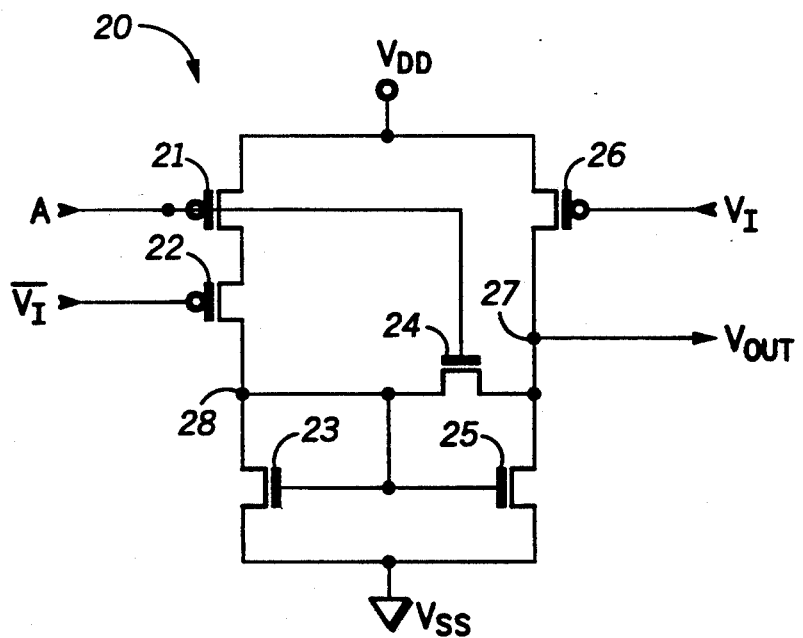
FIG. 2 illustrates in schematic form a low power level converter circuit in accordance with the present invention.

FIG. 2 depicts in schematic diagram form a low power level converter 20 in accordance with the present invention. Converter 20 includes P-channel transistors 21, 22 and 26 and N-channel transistors 23, 24 and 25. P-channel transistor 21 has a source connected to $V_{DD}$, a gate for receiving a control voltage labelled "A", and a drain. P-channel transistor 22 has a source connected to the drain of transistor 21, a gate for receiving input signal $\overline{V_I}$, and a drain. N-channel transistor 23 has a drain connected to the drain of transistor 22, a gate connected to the drain of transistor 22, and a source connected to $V_{SS}$. N-channel transistor 24 has a source connected to the drain of transistor 22, a gate connected to the gate of transistor 21, and a drain. Note that source and drain designations depend on the voltages applied. N-channel transistor 25 has a source connected to $V_{SS}$, a drain connected to the drain of transistor 24, and a gate connected to the source of transistor 24. P-channel transistor 26 has a source connected to $V_{DD}$, a gate for receiving input signal $V_I$, and a drain connected to the drain of transistor 25 at a node 27 and providing signal $V_{OUT}$ at CMOS levels, thereon. $V_{DD}$ is equal to approximately zero volts and $V_{SS}$ is between approximately −4.2 volts and −5.4 volts. Again, $V_I$ and $\overline{V_I}$ alternately swing between −0.8 volts and −2.3 volts.

For converter 20 to output a low CMOS level, $V_I$ is a logic high and will be sufficiently positive above $V_T$ to make P-channel transistor 26 non-conductive, $\overline{V_I}$ will be negative enough below $V_T$ to cause P-channel transistor 22 to become conductive. If control signal A, received at the gates of transistors 21 and 24, is a CMOS logic high, P-channel transistor 21 will be non-conductive and N-channel transistor 24 will be conductive. Because N-channel transistor 24 is conductive, N-channel transistors 23 and 25 will also be conductive. A conductive path is formed by transistors 23, 24 and 25 between node 27 and $V_{SS}$, thus pulling $V_{OUT}$ at node 27 to a logic low, substantially $V_{SS}$. Because transistors 21 and 26 are nonconductive, $V_{DD}$ is substantially disconnected from $V_{SS}$, thereby preventing any DC current flow through converter 20.

For converter 20 to output a high CMOS level, $V_I$ will be negative enough to make P-channel transistor 26 conductive and $\overline{V_I}$ will be positive enough to make P-channel transistor 22 substantially non-conductive. If control signal A is a CMOS logic low, transistor 21 will be conductive and transistor 24 will be non-conductive. Since transistors 22 and 24 are non-conductive, transistors 23 and 25 are also non-conductive. $V_{OUT}$ at node 27 is therefore pulled high through transistor 26. Because transistors 23, 24 and 25 are non-conductive, there is no current path from $V_{DD}$ to $V_{SS}$, preventing any current flow through converter 20.

Converter 20 can be used almost anywhere level converting from ECL levels to CMOS levels is required, such as in address buffers, control buffers, and sense amplifiers.

Figure 3:
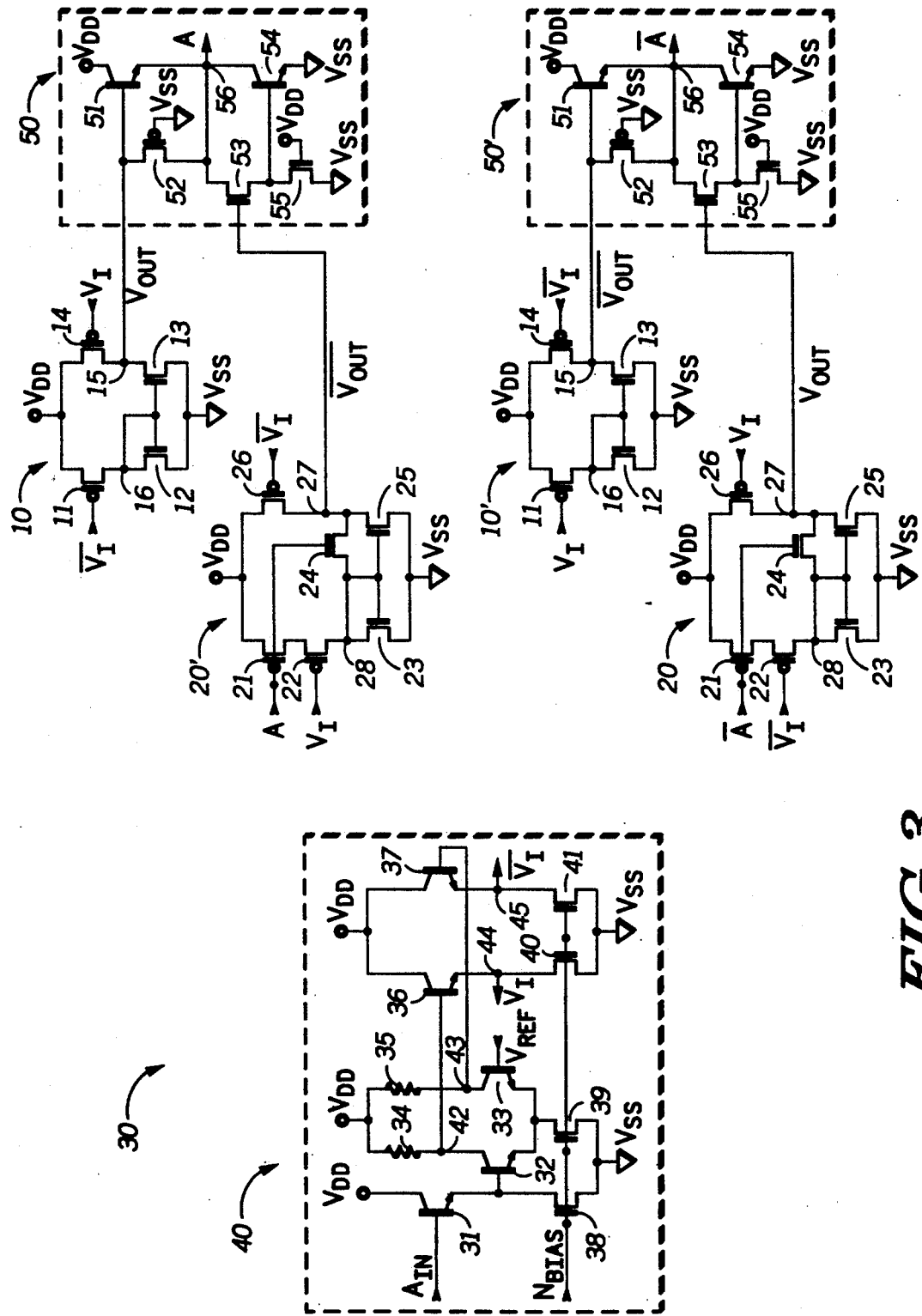
FIG. 3 illustrates in schematic form the low power level converter of FIG. 2 as an ECL-to-CMOS level converter incorporated in an ECL address buffer in accordance with a preferred embodiment of the present invention.

FIG. 3 illustrates in schematic form the low power level converter of FIG. 2 as an ECL-to-CMOS level converter incorporated in an ECL address buffer in accordance with a preferred embodiment of the present invention. ECL address buffer 30 includes ECL input portion 40, converters 10, 10', 20 and 20' and output driver portions 50 and 50'. ECL input portion 40 includes NPN transistors 31, 32, 33, 36 and 37, resistors 34 and 35, and N-channel transistors 38, 39, 40 and 41. NPN transistors 32 and 33, resistors 34 and 35, and N-channel transistor 39 form a differential amplifier. Transistor 31 has a collector connected to $V_{DD}$, a base for receiving an ECL level input signal labelled "$A_{IN}$", and an emitter. Resistor 34 has a first terminal connected to $V_{DD}$ and a second terminal. Resistor 35 has a first terminal connected to $V_{DD}$ and a second terminal. NPN transistor 32 has a collector connected to the second terminal of resistor 34, a base connected to the emitter of transistor 31, and an emitter. NPN transistor 33 has a collector connected to the second terminal of resistor 35, a base for receiving an input reference voltage labelled "$V_{REF}$", which is approximately −2.1 volts, and an emitter connected to the emitter of transistor 32. N-channel transistor 38 has a drain connected to the emitter of transistor 31, a source connected to $V_{SS}$, and a gate for receiving an input voltage labelled "$N_{BIAS}$". N-channel transistor 39 has a drain coupled to the emitters of transistors 32 and 33, a source connected to $V_{SS}$, and a gate for receiving input voltage $N_{BIAS}$.

Voltage $N_{BIAS}$ is about 1.7 volts above $V_{SS}$, which drives the N-channel transistors 38 and 39 into saturation, thereby providing constant current sources and preventing the base-collector diodes of NPN transistors 32 and 33 from becoming forward biased. If the base-collector diodes of transistors 32 and 33 were to become forward biased, their gain would decrease, causing the switching times of transistors 32 and 33 to slow down as the ECL input $A_{IN}$ changes.

Still referring to FIG. 3, NPN transistor 36 has a collector connected to $V_{DD}$, a base connected to the collector of transistor 32, and an emitter for providing analog voltage $V_I$. NPN transistor 37 has a collector connected to $V_{DD}$, a base connected to the collector of transistor 33, and an emitter for providing analog voltage $\overline{V_I}$. N-channel transistor 40 has a drain connected to the emitter of transistor 36, a source connected to $V_{SS}$, and a gate for receiving input voltage $N_{BIAS}$. N-channel MOS transistor 41 has a drain connected to the emitter of transistor 37, a source connected to $V_{SS}$, and a gate for receiving input voltage $N_{BIAS}$.

ECL input portion 40 receives an ECL level input voltage, $A_{IN}$, through the base of transistor 31. Transistors 31 and 38 form an emitter-follower circuit which drops the voltage received at the base of transistor 32 to one $V_{BE}$ (approximately −0.8 volts) below $A_{IN}$. If the voltage at the base of transistor 32 is more negative then $V_{REF}$, which would be the case if $A_{IN}$ was an ECL logic low, then transistor 32 will be nonconductive and transistor 33 will be conductive. A current labelled "$I_{39}$", through transistor 39, will be steered through transistor 33 and the voltage at node 43 will be equal to $V_{DD}$ minus $I_{39}R_{35}$ where $R_{35}$ is the resistance of resistor 35, and the voltage at node 42 will be equal to approximately $V_{DD}$. If the voltage at the base of transistor 32 is less negative then $V_{REF}$, which would be the case if $A_{IN}$ was an ECL logic high, then transistor 32 will be conductive and transistor 33 will be nonconductive. Current $I_{39}$ will be steered through transistor 32 and the voltage at node 42 will be equal to $V_{DD}$ minus $I_{39}R_{34}$ where $R_{34}$ is the resistance of resistor 34, and the voltage at node 43 will be equal to approximately $V_{DD}$.

Transistors 36 and 40 form another emitter-follower circuit where the voltage at node 44, $V_I$, is equal to the voltage at node 42 minus $V_{BE}$. Transistors 37 and 41 also form an emitter-follower circuit where the voltage at node 45, $\overline{V_I}$, is equal to the voltage at node 43 minus $V_{BE}$.

$V_I$ and $\overline{V_I}$ are received by converters 10, 10', 20 and 20'. Node 44 of the ECL input portion 40 is connected to the gate of transistor 14 of converter 10, the gate of transistor 26 of converter 20, the gate of transistor 11 of converter 10', and the gate of transistor 22 of converter 20'. Node 45 of ECL input portion 40 is connected to the gate of transistor 11 of converter 10, the gate of transistor 14 of converter 10', the gate of transistor 22 of converter 20 and the gate of transistor 26 of converter 20'. Converter 10' is structurally the same as converter 10, and converter 20' is structurally the same as converter 20. Converter 10' differs from converter 10 and converter 20' differs from converter 20 only in that the above connections for input voltages $V_I$ and $\overline{V_I}$ have been reversed, so that for input ECL-level signal $A_{IN}$, the CMOS level output signals of converter 10 and 20 will be $V_{OUT}$ and the CMOS level output signals of converters 10' and 20' will be $\overline{V_{OUT}}$.

BICMOS output driver portions 50 and 50' are structurally identical to each other. Driver portions 50 and 50' each include NPN transistors 51 and 54, N-channel transistors 53 and 55, and P-channel transistor 52. NPN transistor 51 has a collector connected to $V_{DD}$, a base for receiving a CMOS level input voltage, and an emitter for providing an output signal labelled "A" for driver portion 50 and labelled "$\overline{A}$" for driver portion 50'. P-channel transistor 52 has a source connected to the base of transistor 51, a gate connected to $V_{SS}$, and a drain. N-channel transistor 53 has a drain connected to the drain of transistor 52, a gate for receiving a CMOS level voltage, and a source. For driver 50, the gate of transistor 53 is connected to node 27 of converter 20' for receiving $\overline{V_{OUT}}$. For driver 50', the gate of transistor 53 is connected to node 27 of converter 20 for receiving $V_{OUT}$. N-channel transistor 55 has a drain connected to the source of transistor 53, a source connected to $V_{SS}$, and a gate connected to the $V_{DD}$. NPN transistor 54 has a collector connected to the emitter of transistor 51 and providing an output signal "A", or "$\overline{A}$" for driver portion 50', thereon, an emitter connected to $V_{SS}$, and a base connected to the source of transistor 53. Node 15 of converter 10 is connected to the base of transistor 51 and node 27 of converter 20' is connected to the gate of transistor 53 of output driver portion 50. Node 15 of converter 10' is connected to the base of transistor 51 and node 27 of converter 20 is connected to the gate of transistor 53 of output driver portion 50'. Output A from node 56 is fed back into the gate of transistor 21 of converter 20', and output $\overline{A}$ is fed back into the gate of transistor 21 of converter 20.

Referring to output driver portion 50 of FIG. 3, if $\overline{V_{OUT}}$ is a CMOS logic high, then $V_{OUT}$ is a CMOS logic low. The base-emitter diode of bipolar transistor 51 of output driver portion 50 will become forward biased, and output A at node 56 will be charged to $V_{DD}$ minus $V_{BE}$, or about −0.8 volts. As output A approaches −0.8 volts, the current through transistor 51 decreases, $V_{BE}$ decreases and transistor 51 becomes less active. Transistor 52, which is effectively a resistor, will allow output A to continue to charge toward $V_{DD}$. At the same time, transistor 53 of output driver portion 50 will be non-conductive because $\overline{V_{OUT}}$ is within $V_T$ of $V_{SS}$, thereby preventing transistor 54 of output driver portion 50 from being forward biased.

Transistor 53 of output driver portion 50' will be conductive, because $V_{OUT}$ is more positive than $V_T$ below $V_{DD}$. The base-emitter diode of transistor 54 will become forward biased allowing output $\overline{A}$ to discharge to $V_{SS}$ plus $V_{BE}$, or about −3.4 volts, assuming $V_{SS}$ was approximately equal to −4.2 volts. The current through transistor 54 will decrease, $V_{BE}$ will decrease causing transistor 54 to become less active. Transistor 55 will allow output $\overline{A}$ to continue to discharge to $V_{SS}$. The base emitter-diodes of transistors 51 and 54 of either output driver portion 50 or 50' are prevented from being forward biased at the same time. If the base-emitter-diodes of transistors 51 and 54 were both forward biased at the same time, a conductive path would be created directly from $V_{DD}$ to $V_{SS}$ allowing a current to flow while both transistors are conductive, know as a crowbar current.

Two converters are used to provide signals $V_{OUT}$ and $\overline{V_{OUT}}$ for each output driver portion 50 and 50' to gain faster switching speeds. Converter 20 uses less power then converter 10, but because two extra transistors are required for converter 20, greater surface area is required to fabricate them on an integrated circuit. In the preferred embodiment as depicted by FIG. 3, two converters 20 of the present invention are used with two prior art converters 10 to reduce the amount of DC current in the circuit while at the same time minimizing the surface area on the integrated circuit. Converters 10 and 20 can be used without a BICMOS output driver portion 50, but the MOS transistors of the converters 10 and 20 would have to be very large if they had to drive large capacitive loads.

TTL logic levels could be provided as outputs A and $\overline{A}$ by simply removing transistors 52 and 55 from BICMOS output driver portions 50 and 50'.

Figure 4:
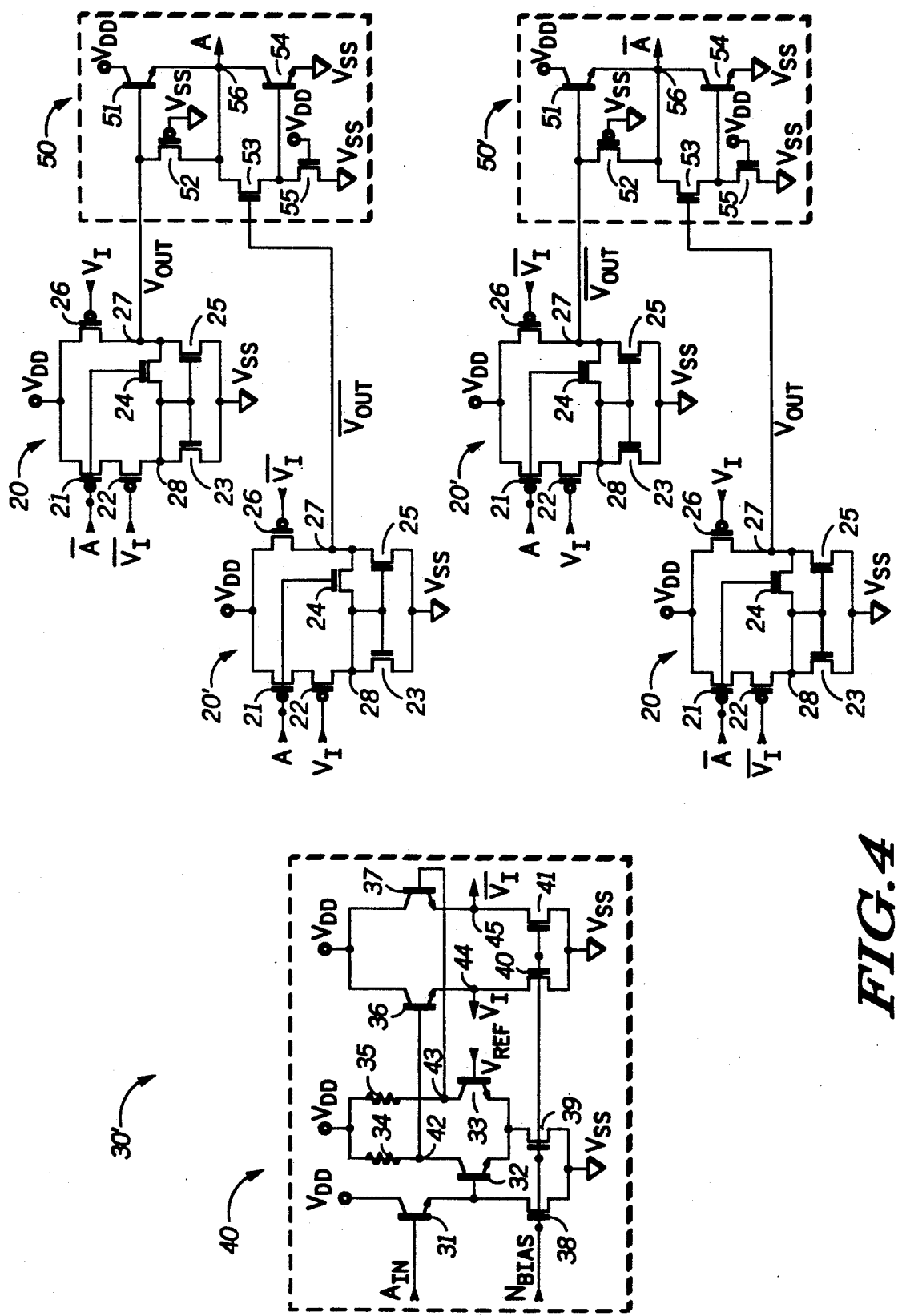
FIG. 4 illustrates in schematic form the low power level converter of FIG. 2 as an ECL-to-CMOS level converter in an alternate embodiment of an ECL address buffer in accordance with the present invention.

FIG. 4 illustrates in schematic form the low power level converter of FIG. 2 as an ECL-to-CMOS level converter in an alternate embodiment of an ECL address buffer 30' in accordance with the present invention. In buffer 30', all of the DC current that was present because of the prior art converters 10 is eliminated, but at the expense of requiring extra space on the chip for the two additional transistors 21 and the two additional transistors 24.

While the invention has been described in the context of a preferred embodiment, it will be apparent to those skilled in the art that the present invention may be modified in numerous ways and may assume many embodiments other than that specifically set out and described above. For example, $V_{DD}$ may be made to equal approximately +5.0 volts and $V_{SS}$ made to equal approximately 0.0 volts. Also, the conductivities of the transistors and power supplies could be switched. Accordingly, it is intended by the appended claims to cover all modifications of the invention which fall within the true spirit and scope of the invention.

I claim:

1. A low power level converter comprising:
 a first transistor having a first current electrode coupled to a first power supply voltage terminal, a control electrode for receiving a control signal, and a second current electrode;
 a second transistor having a first current electrode coupled to said second current electrode of said first transistor, a control electrode for receiving a first input signal, and a second current electrode;
 a third transistor having a first current electrode coupled to said second current electrode of said second transistor, a control electrode coupled to said second current electrode of said second transistor, and a second current electrode coupled to a second power supply voltage terminal;
 a fourth transistor having a first current electrode coupled to said first current electrode of said third transistor, a control electrode coupled to said control electrode of said first transistor for receiving said control signal, and a second current electrode;
 a fifth transistor having a first current electrode coupled to said second current electrode of said fourth transistor, a control electrode coupled to said second current electrode of said second transistor, and a second current electrode coupled to said second power supply voltage terminal; and
 a sixth transistor having a first current electrode coupled to said first power supply voltage terminal, a control electrode for receiving a second input signal, and a second current electrode coupled to said first current electrode of said fifth transistor and for providing an output signal.

2. The low power level converter of claim 1 wherein said control signal is characterized as being a CMOS level signal.

3. The low power level converter of claim 1 wherein at least one of said first, second and sixth transistors are enhancement-mode P-channel MOSFET transistors and at least one of said third, fourth and fifth transistors are enhancement-mode N-channel MOSFET transistors.

4. The low power level converter of claim 1 wherein at least one of said first, second and sixth transistors are P-channel CMOS transistors and at least one of said third, fourth and fifth transistors are N-channel CMOS transistors.

5. A lower power ECL-to-CMOS level converter for receiving an ECL level input signal and providing an output signal at CMOS logic levels, comprising:
 means for receiving an ECL level signal and providing a first voltage and a second voltage of a predetermined logic level in response thereto;
 a first P-channel transistor having a source coupled to a first power supply voltage terminal, a gate for receiving a control signal characterized as being a CMOS-level signal, and a drain;
 a second P-channel transistor having a source coupled to said drain of first P-channel transistor, a gate for receiving said first voltage, and a drain;
 a first N-channel transistor having a drain coupled to said drain of said second P-channel transistor, a source coupled to a second power supply voltage terminal, and a gate coupled to said drain of said first N-channel transistor;
 a second N-channel transistor having a first source/drain terminal coupled to said drain of said second P-channel transistor, a gate coupled to said gate of said first P channel transistor, and a second source/drain terminal;
 a third N-channel transistor having a source coupled to said second power supply voltage terminal, a gate coupled to said gate of said first N-channel transistor, and a drain coupled to said second source/drain terminal of said second N-channel transistor; and
 a third P-channel transistor having a source coupled to said first power supply voltage terminal, a drain coupled to said drain of said third N-channel transistor and providing a CMOS level output signal thereon, and a gate for receiving said second voltage.

6. The low power ECL-to-CMOS level converter of claim 5 further comprising BICMOS output driver means, coupled to said drain of said third P-channel transistor, for providing a second output signal in response to said CMOS-level output signal.

7. The low power ECL-to-CMOS level converter of claim 6 further comprising feedback means, for providing said control signal in response to said second output signal.

8. The low power ECL-to-CMOS level converter of claim 5 further comprising feedback means, for providing said control signal in response to a complement of said output signal.

9. The low power ECL-to-CMOS level converter of claim 5 wherein at least one of said P-channel transistors are enhancement-mode P-channel MOSFET transistors and at least one of said N-channel transistors are enhancement-mode N-channel MOSFET transistors.

10. A low power ECL-to-CMOS level converter for receiving an ECL level input signal and providing an output signal at CMOS levels, comprising:

input means for receiving an ECL-level signal and providing first and second input voltages, said second input voltage reversed in phase relative to said first input voltage;

first and second power supply voltage terminals for supplying first and second operating voltages;

a first P-channel transistor having a source coupled to said first power supply voltage terminal, a gate for receiving a control signal characterized as being a CMOS-level signal, and a drain;

a second P-channel transistor having a source coupled to said drain of first P-channel transistor, a gate for receiving said first input voltage, and a drain;

a first N-channel transistor having a drain coupled to said drain of said second P-channel transistor, a source coupled to said second power supply voltage terminal, and a gate coupled to said drain of said first N-channel transistor;

a second N-channel transistor having a first source/drain terminal coupled to said drain of said first N-channel transistor, a gate coupled to said gate of said first P-channel transistor, and a second source/drain terminal;

a third N-channel transistor having a source coupled to said second power supply voltage terminal, a gate coupled to said drain of said first N-channel transistor, and a drain coupled to said second source/drain terminal of said second N-channel transistor;

a third P-channel transistor having a source coupled to said first power supply voltage terminal, a drain coupled to said drain of said third N-channel transistor and providing a CMOS-level output voltage thereon, and a gate for receiving said second input voltage; and BICMOS output driver means, coupled to said drain of said third P-channel transistor for providing an output signal of said ECL-to-CMOS level converter in response to a complement of said CMOS-level signal and for providing said output signal as said control signal.

11. The low power ECL-to-CMOS level converter of claim 10 wherein at least one of said P-channel transistors are enhancement-mode P-channel MOSFET transistors and at least one of said N-channel transistors are enhancement-mode N-channel MOSFET transistors.

12. The low power ECL-to-CMOS level converter of claim 10 wherein said output signal of said BICMOS output driver means is characterized as being a TTL-level signal.

* * * * *